United States Patent
Noguchi et al.

[11] Patent Number: 6,040,002
[45] Date of Patent: Mar. 21, 2000

[54] ETCHING RESIST COMPOSITION, PATTERN FORMING METHOD MAKING USE OF THE SAME, PRINTED-WIRING BOARD AND ITS PRODUCTION

[75] Inventors: Hiromichi Noguchi, Atsugi; Hiroshi Sugitani, Machida; Yutaka Koizumi, Yokohama; Tadayoshi Inamoto, Hachioji; Kiyomi Aono, Kokubunjii; Yoshie Nakata, Kawasaki, all of Japan

[73] Assignee: Canon Kabushiki Kaisha, Tokyo, Japan

[21] Appl. No.: 08/801,419

[22] Filed: Feb. 18, 1997

Related U.S. Application Data

[62] Division of application No. 08/353,694, Dec. 12, 1994, abandoned.

[30] Foreign Application Priority Data

Dec. 14, 1993 [JP] Japan .................. 5-313612

[51] Int. Cl.$^7$ .................. B05D 5/12; H05K 3/06
[52] U.S. Cl. .................. 427/96; 427/259; 427/287; 427/384; 427/388.4; 29/846; 216/13; 438/754
[58] Field of Search .................. 427/96, 256, 258, 427/259, 287, 372.2, 384, 385.5, 388.4; 29/846; 216/13; 438/689, 754

[56] References Cited

U.S. PATENT DOCUMENTS

| | | | |
|---|---|---|---|
| 4,539,363 | 9/1985 | Backhouse | 524/460 |
| 4,717,639 | 1/1988 | Dubin et al. | 430/124 |
| 4,880,667 | 11/1989 | Welch | 427/160 |
| 4,921,899 | 5/1990 | Phan et al. | 524/513 |
| 4,940,628 | 7/1990 | Lin et al. | 428/195 |
| 5,106,417 | 4/1992 | Hauser et al. | 106/20 |
| 5,196,485 | 3/1993 | McMonigal et al. | 428/413 |
| 5,250,758 | 10/1993 | Fjelstad et al. | 174/254 |
| 5,270,078 | 12/1993 | Walker et al. | 427/264 |
| 5,288,589 | 2/1994 | McKeever et al. | 430/262 |
| 5,290,602 | 3/1994 | Argyropoulos et al. | 427/421 |
| 5,368,891 | 11/1994 | Sagara et al. | 427/258 |
| 5,369,178 | 11/1994 | Miyazaki et al. | 525/155 |
| 5,466,653 | 11/1995 | Ma et al. | 503/200 |
| 5,738,916 | 4/1998 | Noguchi et al. | 427/511 |

FOREIGN PATENT DOCUMENTS

| | | |
|---|---|---|
| 0376284 | 7/1990 | European Pat. Off. . |
| 0425439 | 5/1991 | European Pat. Off. . |
| 3740149 | 6/1989 | Germany . |

*Primary Examiner*—Marie Yamnitzky
*Attorney, Agent, or Firm*—Fitzpatrick, Cella Harper & Scinto

[57] ABSTRACT

An etching resist composition containing at least a polymeric compound having an acid value of not less than 35, a base, and water, and having a viscosity of 10 centipoises or below.

34 Claims, No Drawings

ETCHING RESIST COMPOSITION, PATTERN FORMING METHOD MAKING USE OF THE SAME, PRINTED-WIRING BOARD AND ITS PRODUCTION

This application is a division, of application Ser. No. 08/353,694 filed Dec. 12, 1994, now abandoned

BACKGROUND OF THE INVENTION

1. Field of the invention

This invention relates to a novel composition having etching resist properties, a pattern forming method making use of the composition, a printed-wiring board and a process for producing the printed-wiring board.

More particularly, this invention is concerned with printed-wiring board processing in which, in forming a copper printed-wiring pattern, a resist pattern for etching a copper-clad laminate is directly drawn on copper foil by ink-jet printing.

2. Related Background Art

In conventional subtractive processes used in printed-wiring board processing, wiring patterns are formed by preparing pattern films by means of a laser plotter in accordance with wiring pattern data outputted from a CAD (computer-aided design system), and etching copper foil by using a resist ink or a dry film resist.

In such conventional processes, it is necessary to first form a pattern film, and to prepare a printing plate in the case when a resist ink is used or to take the steps of lamination, exposure and development in the case when a dry film resist is used.

Such methods currently used can be said to be a method in which the digitized wiring data are returned to an analogic image forming step. Screen printing has a limit to work size because of the printing precision of the plate. The dry film process is a photographic process and, though promising a high precision, requires many steps, inevitably resulting in a reasonably high cost especially for the manufacture in small lot.

SUMMARY OF THE INVENTION

An object of the present invention is to provide a pattern forming method, a process for producing a printed-wiring board and an etching resist composition used therein, that can decrease the number of steps for forming copper printed wiring patterns and can achieve a cost reduction.

Another object of the present invention is to provide an etching resist composition that enables printing on a substrate having no liquid-absorption, enables stripping of resist patterns printed, and has etching resist properties.

The above objects of the present invention can be achieved by the invention described below.

The present invention is an etching resist composition comprising a polymeric compound having an acid value of not less than 35, a base, and water, and having a viscosity of 10 centipoises or below.

In another embodiment, the present invention is an etching resist composition comprising a polymeric compound having an acid value of not less than 35, a number average molecular weight of not more than 40,000 and a glass transition temperature of 60° C. or above, a base, and water, and having a viscosity of 10 centipoises or below.

In a preferred embodiment of the present invention, the etching resist composition further contains a silicone type surface active agent or contains a thixotropic compound, contains a base having a boiling point of 190° C. or below at normal pressure and further contains a coloring material.

The present invention is also a pattern forming method comprising the steps of;
  patternwise imparting the etching resist composition described above to the surface of a substrate by ink-jet printing; and
  evaporating the solvent of the composition patternwise imparted.

The present invention is still also a process for producing a printed-wiring board, comprising the steps of;
  patternwise imparting the etching resist composition described above to the surface of a copper-foil laminated substrate by ink-jet printing;
  evaporating the solvent of the composition patternwise imparted; and
  etching the copper foil.

The process may further comprise the step of removing the etching resist composition pattenwise formed.

The present invention is further a printed-wiring board obtained by the production process described above.

DESCRIPTION OF THE PREFERRED EMBODIMENTS

The present invention provides a technique for printing an etching resist pattern on a copper-clad laminate by a digital image recording system directly from wiring data prepared by CAD.

In the present invention, the use of the etching resist composition described above makes it possible to obtain superior pattern forming performance, etching resist properties and post-etching strippability. A volatile base may also be used to dissolve the polymeric compound, whereby better etching resist properties can be obtained. In the etching resist composition, a silicone type surface active agent and/or a thixotropic compound may be incorporated. The incorporation of these makes it possible to obtain a clearer pattern form as copper printed-wiring on the copper-clad laminate. More specifically, when this composition is ejected onto a usual brush-polished copper-clad laminate to print a resist pattern, the composition has a wetting-spreadability such that a pattern can be drawn in a given form and size without being affected by polish marks on the surface. The resist pattern formed at the same time serves as a copper foil etching resist and has a resistance to both acidic etchants and alkaline etchants, in other words, a resistance to chemical matter and an adhesion to substrates. Incorporation of a monohydric alcohol into this composition improves bubble generation and drop ejection performance in bubble jet type ink-jet printing and brings about a stabler printing suitability.

The polymeric compound used in the etching resist composition of the present invention includes the following.

(1) Alkali-soluble acrylic resins obtained by copolymerization of a carboxyl group-containing monomer such as acrylic acid, methacrylic acid, crotonic acid or maleic acid with styrene or an alkyl acrylate.

(2) Alkali-soluble polymers of polyether, polyester or polyurethane having a carboxyl group side chain in the molecular chain.

(3) Maleic acid addition compounds of rosin or rosin derivatives.

(4) Polysaccharides containing a carboxyl group.

These compounds are neutralized by a base to form compounds readily soluble in water. The base used can be exemplified by ammonia, methylamine, ethylamine, dimethylamine, diethylamine, n-butylamine, di-n-butylamine, trimethylamine, ethylenediamine, diethylenetriamine, triethylenetetramine, tetraethylenepentamine, propylenediamine, ethanolamine, hexylamine, laurylamine, diethanolamine, triethanolamine, morpholine, piperidine, propylamine, isopropylamine, isobutylamine, NaOH, LiOH and KOH. Here, as the base used, organic bases are preferred in order to endow the etching resist composition with the chemical resistance to etchants or etching solutions and to make the etching resist composition strippable from the substrate by a strong alkali. Among these, bases having a high volatility are particularly preferred, and bases having themselves a boiling point of 190° C. or below at normal pressure are preferred.

The resin applied to the surface of a copper-clad laminate by printing becomes insoluble to acidic etchants as a result of evaporation of volatile bases such as ammonia and also becomes not easily soluble to basic etchants to have resistance to etching solutions, so that it has etching resist properties. The polymeric compound contained in the composition has an acid value and can be still dissolved in, or stripped by, strongly alkaline stripping solutions used after etching. A solubility difference with respect to this basicity is utilized so that the composition can have both etching resist properties and stripping performance.

—Polymeric Compound with Acid Value—

The alkali-soluble acrylic resin used as the polymeric compound having an acid value of not less than 35 includes alkali-soluble acrylic resins obtained by copolymerization of a carboxyl group-containing monomer such as acrylic acid, methacrylic acid, crotonic acid or maleic acid with styrene, an alkyl acrylate or an acrylic or methacrylic ester having a hydroxyl group as exemplified by 2-hydroxyethyl acrylate or methacrylate. Theoretically, the polymeric compound having an acid value of 35 can be produced using, in the case of acrylic acid, 4.5% by weight of acrylic acid as percentage of monomers charged in polymerization. If the acid value is too low, the resin can not be dissolved only by its neutralization with the base, and requires use of other polar solvent in combination. These acrylic resins may preferably have a glass transition temperature (Tg) of 60° C. or above in view of its relation to ethcing temperature, and preferably be a polymer having a number average molecular weight of not more than 40,000 in order to control the viscosity of the composition and make the composition dissolve with ease.

Examples of specific structures of these are the following copolymers.

A-1: Acrylic acid/methyl methacrylate=10/90 Theoretical acid value: 78; weight average molecular weight: 15,000; Tg: 98° C.

A-2: Acrylic acid/ethyl methacrylate/2-hydroxyethyl acrylate=15/60/25 Theoretical acid value: 117; weight average molecular weight: 20,000; Tg: 77° C.

A-3: Acrylic acid/styrene/2-hydroxyethyl acrylate=5/70/25 Theoretical acid value: 39; weight average molecular weight: 16,500; Tg: 83° C.

A-4: Methacrylic acid/methyl methacrylate/ 2-hydroxyethyl acrylate=25/60/15 Theoretical acid value: 163; weight average molecular weight: 35,000; Tg: 105° C.

Saturated polyesters having an acid value are also materials preferable as the polymeric compound used in the present invention. Starting materials for the saturated polyesters may be the same as materials hitherto used in coating compositions and inks. To impart the acid value thereto, polybasic acids such as trimellitic anhydride may be used so that free acids remain, whereby they can be readily synthesized.

The starting materials for the saturated polyesters include polyhydric alcohols such as ethylene glycol, propylene glycol, 1,4-butanediol, 1,6-hexanediol and oligomers of these, trimethylol propane, pentaerythritol, dimethylol propionic acid, trishydroxyaminomethane, trishydroxyaminoethane, and aliphatic dibasic acids such as succinic acid, adipic acid, orthophthalic anhydride and trimellitic anhydride.

Examples of these compounds are as follows

B-1: Oligoesters with a molecular weight of 500, comprised of ethylene glycol, orthophthalic anhydride and succinic anhydride and having a hydroxyl group at the terminal, having been subjected to chain extension by the use of trimellitic anhydride to impart carboxyl groups at the same time. Theoretically, six carboxyl groups per molecule are introduced to obtain polyesters with an average molecular weight of 2,700, having a hydroxyl group at the terminal.

B-2: Oligoesters with a molecular weight of 600, comprised of 1,4-butanediol and adipic acid, having been subjected to chain extension by the use of trimellitic anhydride to impart carboxyl groups at the same time. Theoretically, six carboxyl groups per molecule are introduced to obtain polyesters with an average molecular weight of 2,700, having a hydroxyl group at the terminal.

Polyurethanes having an acid value are also preferable materials used as the polymeric compound used in the present invention. The polyurethanes may be formed of either polyether or polyester as the basic structure, and those hitherto commonly used can be used. To impart the acid value thereto, compounds having two hydroxyl groups and one carboxyl group in the molecule, as shown in Exemplary Compounds 1 to 6 below, may be used so as to make free acids remain in the molecular chain.

Materials for imparting acid value:

Exemplary Compound 1

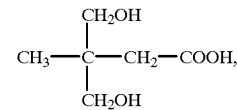

Exemplary Compound 2

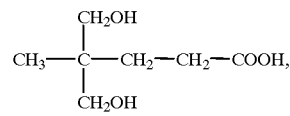

Exemplary Compound 3

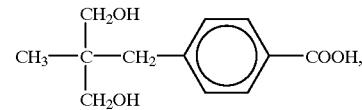

Exemplary Compound 4

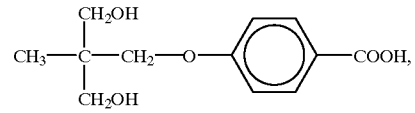

Exemplary Compound 5

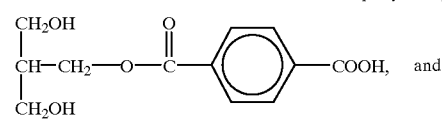 and

-continued

Exemplary Compound 6

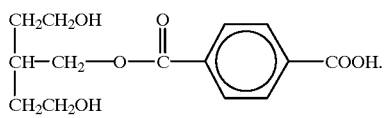

Specific compounds obtained in this way and used in the present invention are materials as shown below.

C-1: Polyethylene glycol (molecular weight: 400), dimethylolpropionic acid and 1,4-tolylene diisocyanate are reacted with each other in equimolar quantities to obtain a polyurethane with an average molecular weight of 3,000, having an acid value.

C-2: Polypropylene glycol (molecular weight: 400), Exemplary Compound 5 and 1,4-tolylene diisocyanate are reacted with each other in equimolar quantities to obtain a polyurethane with an average molecular weight of 3,000, having an acid value.

Natural materials having an acid value are also useful in the present invention. As examples thereof, they include rosin (acid value: 90 to 180), polymer rosin (acid value: 150 or less), hydrogenated rosin (acid value: 160 or less), disproportionated rosin (acid value: 150 or less), adducts of rosin with an α,β-unsaturated dicarboxylic acid, alkyd resins, and adducts of terpene with an α,β-unsaturated dicarboxylic acid. Here, the α,β-unsaturated dicarboxylic acid may include maleic acid, fumaric acid, citraconic acid, itaconic acid, mesaconic acid and aconitic acid.

Incorporation of a silicone type surface active agent into the composition having etching resist properties enables control of wetting-spreadability when the resist pattern is printed on the copper-clad laminate, so that preferable dot forms can be obtained. The silicone type surface active agent used here may include nonionic surface active agents having an ethylene oxide chain as a hydrophilic group and a dimethyl siloxane chain as a silicone chain. These materials can be selected from those commercially available when used.

Incorporation of a thixotropic compound into the composition of the present invention also enables control of wetting-spreadability, so that preferable dot forms can be obtained. This thixotropic compound is a generic term of compounds having the action to thicken, agglomerate or gelatinize compositions containing water, as typified by dibenzylidene sorbitol, alginic acid and chitosan. When the composition containing such a compound is used, droplets ejected and impacted onto the substrate can quickly thicken as a result of slight evaporation of water or as a result of evaporation of mediums accelerated by previously heating the substrate, so that unwanted spread of dots can be prevented to make it easy to control pattern form and size.

—Coloring Material—

In the liquid mixture having etching resist properties of the present invention, a coloring material may be dissolved or dispersed in order to make printed patterns visible. It may be selected from high-purity dyes having been hitherto developed as dyes for ink-jet recording, including acid dyes, direct dyes, basic dyes, oil-soluble dyes, disperse dyes, reactive dyes and food dyes. Examples thereof are, when printed patterns are colored in blue as commonly done in resist inks, C.I. Direct Blue 86, C.I. Direct Blue 199, C.I. Acid Blue 9 and C.I. Oil Blue 9.

—Medium—

The etching resist composition of the present invention makes use of water as a main medium.

As mediums other than water, any of water-soluble organic solvents having a high wettability, capable of being evaporated with difficulty and having a good hydrophilicity can be added. It is possible to use ethylene glycol, diethylene glycol, triethylene glycol, tripropylene glycol, glycerol, 1,2,4-butanetriol, 1,2,6-hexanetriol, 1,2,5-pentanetriol, 1,2-butanediol, 1,3-butanediol, 1,4-butanediol, dimethylsulfoxide, diacetone alcohol, glycerol monoallyl ether, propylene glycol, butylene glycol, polyethylene glycol 300, thiodiglycol, N-methyl-2-pyrrolidone, 2-pyrrolidone, λ-bytyrolactone, 1,3-dimethyl-2-imidazolidinone, sulforane, trimethylol propane, neopentyl glycol, ethylene glycol monomethyl ether, ethylene glycol monoethyl ether, ethylene glycol monoisopropyl ether, ethylene glycol monoallyl ether, diethylene glycol monomethyl ether, diethylene glycol monoethyl ether, triethylene glycol monomethyl ether, propylene glycol monoethyl ether, dipropylene glycol monoethyl ether, β-dihydroxyethylurea, urea, acetonyl acetone, pentaerythritol, 1,4-cyclohexanediol, hexylene glycol, ethylene glycol monopropyl ether, ethylene glycol monobutyl ether, ethylene glycol monoisobutyl ether, ethylene glycol monophenyl ether, diethylene glycol diethyl ether, diethylene glycol monobutyl ether, diethylene glycol monoisobutyl ether, triethylene glycol monobutyl ether, triethylene glycol dimethyl ether, triethylene glycol diethyl ether, tetraethylene glycol dimethyl ether, tetraethylene glycol diethyl ether, propylene glycol monobutyl ether, dipropylene glycol monomethyl ether, dipropylene glycol monopropyl ether, dipropylene glycol monobutyl ether, tripropylene glycol monomethyl ether, glycerol monoacetate, glycerol diacetate, glycerol triacetate, ethylene glycol monomethyl ether acetate, diethylene glycol monomethyl ether acetate, cyclohexanol, 1,2-cyclohexanediol, 1-butanol, 3-methyl-1,5-pentanediol, 3-hexene-2,5-diol, 2,3-butanediol, 1,5-pentanediol, 2,4-pentanediol, 2,5-hexanediol, ethanol, n-propanol, 2-propanol, 1-methoxy-2-propanol, furfuryl alcohol, and tetrahydrofurfuryl alcohol. The water soluble organic solvents may preferably be used in a total amount of from 5 to 40% by weight based on the weight of the whole composition. Since, however, these solvents can be removed with difficulty and may affect resist properties, they may preferably be used in an amount as small as possible.

The respective components in the composition having etching resist properties of the present invention may be mixed in such a proportion that the polymeric compound having an acid value is added in an amount of from 3 to 20% by weight in the composition and the corresponding base is in an amount not smaller than the equivalent weight calculated from the acid value. As a whole, the viscosity of the composition is controlled so as not to be more than 10 centipoises.

In the composition of the present invention, it is unnecessary to use any particular adhesion improver. It, however, is possible to use the above resin in combination, which is effective for delicate adjustment of softening temperatures and strippability. Acrylic resins and rosin derivatives are effective for improving hardness of resist coatings, and polyester resins and urethane resins for improving adhesion thereof. The silicone type surface active agent can be effective when used so far as it can dissolve, i.e., in an amount of not more than about 0.5% by weight; and the thixotropic compound, so far as the viscosity is ensured, i.e., in an amount of not more than about 1.0% by weight.

The pattern forming method and the process for producing a printed-wiring board according to the present invention are carried out in the following way.

A copper-clad laminate for the printed-wiring board is surface-conditioned as usual (e.g., by chemical polishing, brush polishing or sandblasting), followed by drying. The etching resist composition of the present invention is charged in an ink-jet recording device to make a print in a wiring pattern on the substrate. The substrate on which the pattern has been printed is dried to remove the medium. The substrate on which a resist pattern has been thus formed is etched using a copper etching solution of a ferric chloride type, cupric chloride type or ammonium persulfate type. From the substrate having been thus etched, the resist is stripped by means of a resist stripping device making use of sodium hydroxide or an organic alkali.

The present invention will be described below in greater detail by giving Examples. In the following, "part(s)" refers to "part(s) by weight".

Example 1

An etching resist composition was prepared using the following components.

| | |
|---|---|
| Rosin-modified maleic acid resin (acid value: 135) | 10 parts |
| Ammonia | 0.7 part |
| Water | 90 parts |
| C.I. Direct Blue 86 | 0.2 part. |

This composition had a viscosity of 7.5 cP. This composition was charged in an ink-jet printer of a system in which the number of nozzles is 48, resolution in the directions of primary and secondary scanning is 600 dpi, droplet volume is 35 pl and a piezoelectric element with a drive frequency of 4 kHz is used as an ejection energy generating element. Using this printer, an etching resist pattern was printed on a copper-clad laminate for a printed-wiring board having been brush-polished (for public use; one-side copper foil thickness: 35 μm; substrate thickness: 1.2 mm). The wiring pattern was dot-printed in accordance with printing data prepared from wiring pattern data previously made up. The wiring pattern thus printed had a wiring width of about 155 μm and a pad diameter of 1.0 mm. After the pattern formed of the composition in a wiring form was printed, the substrate was heat-dried in a 85° C. oven for 15 minute to remove solvent components. After the substrate was cooled, etching was carried out using a ferric chloride type etching solution and a copper chloride type etching solution each. The etching was carried out at 50° C. for 4 minutes by spraying. After the etching, the resulting substrate was washed with water and wiring width was measured to obtain the results that the width of copper wiring was, on the average, as follows:

In the case of the ferric chloride type etching solution; wiring with: 123 μm, pad diameter: 0.94 mm; and in the case of the copper chloride type etching solution, wiring with: 120 μm, pad diameter: 0.92 mm.

Example 2

An etching resist composition was prepared using the following components.

| | |
|---|---|
| Acrylic resin (A-1) (Acid value: 140) | 10 parts |
| Ammonia | 0.7 part |
| Water | 90 parts |
| C.I. Direct Blue 86 | 0.2 part. |

This composition had a viscosity of 4.5 cP.

Example 3

An etching resist composition was prepared using the following components.

| | |
|---|---|
| Polyester resin (B-1) (Acid value: 125) | 10 parts |
| Ammonia | 0.7 part |
| Water | 90 parts |
| C.I. Direct Blue 86 | 0.2 part. |

This composition had a viscosity of 4.3 cP.

The foregoing compositions of Examples 2 and 3 were tested in the same manner as in Example 1. As a result, like Example 1, good etching resist properties and strippability were shown.

Example 4

An etching resist composition was prepared using the following components.

| | |
|---|---|
| Polyurethane resin (C-1) (Acid value: 95) | 10 parts |
| Ammonia | 0.5 part |
| Diethylene glycol | 30 parts |
| Isopropyl alcohoi | 5 parts |
| Water | 50 parts |
| C.I. Direct Blue 86 | 0.2 part. |

This composition had a viscosity of 6.5 cP.

Example 5

An etching resist composition was prepared using the following components.

| | |
|---|---|
| Polyurethane resin (C-1) (Acid value: 60) | 10 parts |
| Ammonia | 0.5 part |
| N-methylpyrrolidone | 30 parts |
| Isopropyl alcohol | 5 parts |
| Water | 50 parts |
| C.I. Direct Blue 86 | 0.2 part. |

This composition had a viscosity of 5.5 cP.

The compositions of Examples 4 and 5 were each charged in an ink-jet printer of a bubble jet system in which the number of nozzles is 128, resolution in the directions of primary and secondary scanning is 600 dpi, droplet volume is 35 pl and drive frequency is 4 kHz. Subsequently, resist patterns were formed in the same manner as in Example 1 and etching and stripping were tested similarly. As a result, like Example 1, good resist properties and strippability were shown.

As described above, the present invention can provide an etching resist composition having superior etching resist properties and post-etching strippability.

Imparting such an etching resist composition to the surface of a substrate by ink-jet printing can provide a printed-wiring board through steps less in number than those in conventional methods and also with a cost reduction.

What is claimed is:

1. A process for producing a printed-wiring board, comprising steps:
   i) patternwise imparting an etching resist aqueous composition to a surface of a copper-foil laminated substrate by ink-jet printing, said etching resist aqueous composition having a viscosity of 10 cP or below and comprising a base, water, and a polymeric compound which is neutralized by said base to form a compound soluble in water and said aqueous composition;
   ii) drying the etching resist aqueous composition imparted to the surface of the copper-foil laminated substrate; and
   iii) etching the copper-foil which is not covered with the dried etching resist aqueous composition.

2. The process according to claim 1, wherein the aqueous composition further comprises a silicone surface active agent.

3. The process according to claim 1, wherein the aqueous composition further comprises a thixotropic compound.

4. The process according to claim 1, wherein the aqueous composition comprises a base having a boiling point of 190° C. or below at normal pressure.

5. The process according to claim 1, wherein the ink-jet printing is of a bubble jet system.

6. The process according to claim 1, further comprising the step of removing the dried etching resist on the copper-foil as a step iv), wherein the step iv) is conducted after the step iii).

7. The process according to claim 1, wherein said polymeric compound is selected from the group consisting of alkali-soluble polymers of polyether, polyester, or polyurethane, maleic acid addition compounds of rosin or rosin derivatives, and polysaccharides containing a carboxylic group.

8. The process according to claim 1, wherein said polymeric compound is an alkali-soluble acrylic resin comprising a copolymer of a monomer having a carboxyl group and styrene or alkyl acrylate.

9. The process according to claim 8, wherein the monomer having a carboxyl group is selected from the group consisting of acrylic acid, methacrylic acid, crotonic acid and maleic acid.

10. The process according to claim 1, wherein said polymeric compound is an alkali-soluble acrylic resin comprising a copolymer of a monomer having a carboxyl group and (meth)acrylic acid ester having a hydroxyl group.

11. The process according to claim 10, wherein the monomer having a carboxyl group is selected from the group consisting of acrylic acid, methacrylic acid, crotonic acid and maleic acid.

12. The process according to claim 10, wherein the (meth)acrylic acid ester having a hydroxyl group is selected from the group consisting of 2-hydroxyethyl acrylate or 2-hydroxyethyl methacrylate.

13. The process according to any one of claims 8 or 10, wherein the alkali-soluble acrylic resin has an acid value of not less than 35.

14. The process according to claim 13, wherein the alkali-soluble acrylic resin is selected from the group consisting of polymers having compositions (A-1), (A-2), (A-3) and (A-4):

(A-1) acrylic acid/methyl methacrylate (10/90) copolymer having an acid value of 78 and a weight average molecular weight of 15,000;

(A-2) acrylic acid/ethyl methacrylate/2-hydroxyethyl acrylate (15/60/25) terpolymer having an acid value of 117 and a weight average molecular weight of 20,000;

(A-3) acrylic acid/styrene/2-hydroxyethyl acrylate (5/70/25) terpolymer having an acid value of 39 and a weight average molecular weight of 16,500; and (A-4) methacrylic acid/methyl methacrylate/2-hydroxyethyl acrylate (25/60/15) terpolymer having an acid value of 163 and a weight average molecular weight of 35,000.

15. The process according to claim 1, wherein the polymeric compound is a saturated polyester having an acid value.

16. The process according to claim 15, wherein the saturated polyester having an acid value is a polyester of an oligoester and trimellitic anhydride, the oligoester being composed of ethylene glycol, orthophthalic anhydride and succinic anhydride.

17. The process according to claim 15, wherein the saturated polyester having an acid value is a polyester of an oligoester and trimellitic anhydride, the oligoester being composed of 1,4-butanediol and adipic acid.

18. The process according to claim 1, wherein the polymeric compound is a polyurethane having an acid value.

19. The process according to claim 18, wherein the polyurethane having an acid value is obtained by reacting a polyether or polyester with a compound having two hydroxyl groups and one carboxyl group in the compound.

20. The process according to claim 19, wherein the compound is selected from the group consisting of compounds represented by the following formulae:

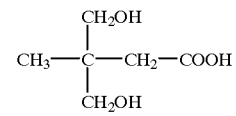

Exemplary Compound 1

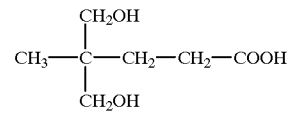

Exemplary Compound 2

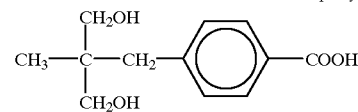

Exemplary Compound 3

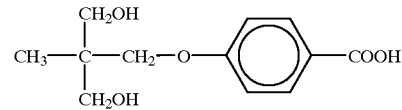

Exemplary Compound 4

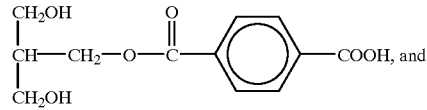

Exemplary Compound 5

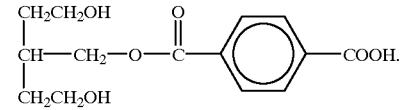

Exemplary Compound 6

21. The process according to claim 18, wherein the polyurethane having an acid value is selected from the group consisting of polymers made from compositions (C-1) or (C-2);

(C-1) polyethylene glycol/dimethylolpropionic acid/1,4-tolylene diisocyanate; or (C-2) polypropylene glycol/a compound of the formula

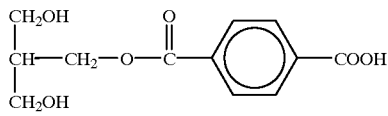

/1,4-tolylene diisocyanate.

22. The process according to claim 1, wherein the polymeric compound is a natural material having an acid value.

23. The process according to claim 22, wherein the natural material having an acid value is selected from the group consisting of rosin having an acid value of from 90 to 180, polymer rosin having an acid value of 150 or less, hydrogenated rosin having an acid value of 160 or less, disproportionated rosin having an acid value of 160 or less, an adduct of rosin with $\alpha,\beta$-unsaturated dicarboxylic acid, alkyd resin and an adduct of terpene with $\alpha,\beta$-unsaturated dicarboxylic acid.

24. The process according to claim 23, wherein the $\alpha,\beta$-unsaturated dicarboxylic acid is selected from the group consisting of maleic acid, fumaric acid, citraconic acid, itaconic acid, mesaconic acid and aconitic acid.

25. The process according to claim 1, wherein the base is selected from the group consisting of ammonia, methylamine, ethylamine, dimethylamine, diethylamine, n-butylamine, di-n-butylamine, trimethylamine, ethylenediamine, diethylenetriamine, triethylenetetramine, tetraethylenepentamine, propylenediamine, ethanolamine, hexylamine, laurylamine, diethanolamine, triethanolamine, morpholine, piperidine, propylamine, isopropylamine, isobutylamine, NaOH, LiOH and KOH.

26. The process according to claim 1, wherein the step iii) is conducted with ferric chloride etching solution.

27. The process according to claim 1, wherein the step iii) is conducted with copper chloride etching solution.

28. A process for producing a printed-wiring board, comprising steps:

i) patternwise imparting an etching resist aqueous composition to a surface of a copper-foil laminated substrate by ink-jet printing, said etching resist aqueous composition having a viscosity of 10 cP or below, and comprising a base, water, and an alkali-soluble acrylic resin which has an acid value of not less than 35, a number average molecular weight of not more than 40,000, and a glass transition temperature of 60° C. or above;

ii) drying the etching resist aqueous composition imparted to the surface of the copper-foil laminated substrate; and iii) etching the copper-foil which is not covered with the dried etching resist aqueous composition.

29. The process for producing a printed wiring board according to claim 28, wherein the alkali-soluble acrylic resin is present in the aqueous composition in an amount ranging from 3% by weight to 20% by weight of the aqueous composition.

30. The process for producing a printed wiring board according to claim 29, wherein the aqueous composition further comprises a silicone surface active agent.

31. The process for producing a printed wiring board according to claim 28, wherein the aqueous composition further comprises a thixotropic compound.

32. The process for producing a printed wiring board according to claim 28, wherein the base has a boiling point of 190° C. or below at normal pressure.

33. The process for producing a printed wiring board according to claim 28, further comprising a step of removing the dried etching resist on the copper-foil as a step iv), wherein the step iv) is conducted after the step iii).

34. The process for producing a printed wiring board according to claim 28, wherein the ink-jet printing is of a bubble jet system.

* * * * *

UNITED STATES PATENT AND TRADEMARK OFFICE
CERTIFICATE OF CORRECTION

PATENT NO. : 6,040,002

DATED : March 21, 2000

INVENTOR(S) : HIROMICHI NOGUCHI, ET AL.

Page 1 of 2

It is certified that error appears in the above-identified patent and that said Letters Patent is hereby corrected as shown below:

Title page,

[75] INVENTORS:
"Kokubunjii" should read --Kokubunji--.

Title page,

[56] REFERENCES CITED; FOREIGN PATENT DOCUMENTS:
"*Attorney, Agent, or Firm*—Fitzpatrick, Cella Harper & Scinto" should read --*Attorney, Agent, or Firm*—Fitzpatrick, Cella, Harper & Scinto--.

COLUMN 3:
Line 42, "ethcing" should read --etching--.

COLUMN 6:
Line 11, "$\lambda$-bytyrolactone" should read --$\gamma$-butyrolactone--.

COLUMN 7:
Line 54, "with:" should read --width:--;
Line 57, "with:" should read --width:--.

UNITED STATES PATENT AND TRADEMARK OFFICE
CERTIFICATE OF CORRECTION

PATENT NO. : 6,040,002
DATED : March 21, 2000
INVENTOR(S) : HIROMICHI NOGUCHI, ET AL.

It is certified that error appears in the above-identified patent and that said Letters Patent is hereby corrected as shown below:

COLUMN 11:
    Line 3, "glycolla" should read --glycol/a--;
    Line 20, "$\alpha$,62-unsaturated" should read --$\alpha$,$\beta$-unsaturated--.

Signed and Sealed this

Tenth Day of April, 2001

*Attest:*

NICHOLAS P. GODICI

*Attesting Officer*      Acting Director of the United States Patent and Trademark Office